US009359513B1

(12) United States Patent
Takashima et al.

(10) Patent No.: US 9,359,513 B1
(45) Date of Patent: Jun. 7, 2016

(54) DOPANT INKS, METHODS OF MAKING DOPANT INKS, AND METHODS OF USING DOPANT INKS

(71) Applicant: Thin Film Electronics ASA, Oslo (NO)

(72) Inventors: Mao Takashima, Cupertino, CA (US); Inna Tregub, San Jose, CA (US); Wenzhuo Guo, Cupertino, CA (US); Brian Bedwell, Palo Alto, CA (US); Klaus Kunze, Carlsbad, CA (US); Aditi Chandra, Los Gatos, CA (US); Arvind Kamath, Los Altos, CA (US); Jun Li, Milpitas, CA (US); Li Li, Fremont, CA (US); Junfeng Mei, Sunnyvale, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 14/305,559

(22) Filed: Jun. 16, 2014

Related U.S. Application Data

(62) Division of application No. 13/103,782, filed on May 9, 2011, now abandoned.

(60) Provisional application No. 61/332,681, filed on May 7, 2010.

(51) Int. Cl.
*C09D 11/107* (2014.01)
(52) U.S. Cl.
CPC .................... *C09D 11/107* (2013.01)

(58) Field of Classification Search
None
See application file for complete search history.

(56) References Cited

U.S. PATENT DOCUMENTS

| | | | | |
|---|---|---|---|---|
| 3,532,563 A | * | 10/1970 | Genser | 438/562 |
| 4,401,709 A | * | 8/1983 | Prabhu et al. | 428/209 |
| 5,500,127 A | * | 3/1996 | Carey et al. | 210/685 |
| 6,695,903 B1 | * | 2/2004 | Kubelbeck et al. | 106/287.14 |
| 2006/0205879 A1 | * | 9/2006 | Adegawa et al. | 525/132 |
| 2014/0179049 A1 | * | 6/2014 | Nguyen | C08B 11/22 438/57 |

OTHER PUBLICATIONS http://msdssearch.dow.com/PublishedLiteratureDOWCOM/dh_0041/0901b80380041d4e.pdf?filepath=liquidseps/pdfs/noreg/177-01395.pdf&fromPage=GetDoc, 2002.*

* cited by examiner

*Primary Examiner* — Satya Sastri
(74) *Attorney, Agent, or Firm* — Andrew D. Fortney; Central California IP Group, P.C.

(57) ABSTRACT

Printable dopant formulations, methods of making such dopant formulations, and methods of using such dopant formulations are disclosed. The dopant formulations provide a printable dopant ink with a viscosity sufficient to prevent ink spreading when deposited in a pattern on a substrate. Furthermore, an ion exchange purification process provides the dopant formulation with a reduced metal ion concentration, and thus a relatively high purity level. Consequently, the dopant residue remaining on the substrate after curing and/or dopant activation process is relatively uniform, and therefore can be easily removed.

19 Claims, 10 Drawing Sheets

DOPANT INKS, METHODS OF MAKING DOPANT INKS, AND METHODS OF USING DOPANT INKS

RELATED APPLICATIONS

This application is a divisional of U.S. patent application Ser. No. 13/103,782, filed May 9, 2011, which claims the benefit of U.S. Provisional Pat. Appl. No. 61/332,681, filed May 7, 2010, each of which is incorporated herein by reference in its entirety.

FIELD OF THE INVENTION

The present invention generally relates to the field of materials and films for electronic applications. More specifically, embodiments of the present invention pertain to dopant ink formulations, methods of making dopant ink formulations, methods of using dopant ink formulations, and methods of forming a doped semiconductor film.

BACKGROUND

In a scheme of making electronic circuits and/or devices using printing processes, one or more printing processes for printing either or both of N+ and P+ dopants may be employed (see, e.g., U.S. Pat. Nos. 7,701,011 and 7,767,520; and U.S. patent application Ser. No. 11/818,078, filed on Jun. 12, 2007. For example, the process flow may include printing of a dopant composition covering a gate/channel crossover of a transistor structure, but leaving at least part of the source/drain region(s) of the transistor structure open for contact formation. Alternatively, the process flow may include coating the entire substrate with the dopant composition, but leaving or forming via holes over areas where contacts are desired. The dopant composition being deposited may act as a dopant source for doping the underlying silicon, and optionally may also serve as a dielectric layer. Alternatively, the process flow may include coating or printing a dopant ink, doping any underlying silicon and then removing the dopant film entirely prior to depositing the next layer (e.g., an interlayer dielectric, etc.). Compositions that may be suitable for use in printing (e.g., inkjet printing) have been previously described (see, e.g., U.S. Pat. Nos. 7,422,708, 7,553,545, 7,498,015, 7,314,513, 7,485,691, 7,674,926, and 7,879,696; and U.S. patent application Ser. Nos. 11/867,587, 12/175,450 and 12/131,002, respectively filed on Oct. 4, 2007, Jul. 17, 2008, and May 30, 2008.

When printing dopant-containing inks for doping one or more underlying semiconductor films and/or features, a number of challenges can arise. For example, specific challenges in printing dopant-containing inks include (1) control over line shape (e.g., average width and width distribution, average thickness, profile such as dome v. coffee rings, etc.); (2) control over the dopant composition within the printed line; (3) maintaining a tight control over the dopant concentration (e.g., within the underlying semiconductor layer) across the printed line; (4) limited or no doping of the underlying semiconductor layer outside of the printed line; (5) limited or no reaction with other underlying layers which may be present (e.g. silicon oxide, silicon nitride, gate material, etc.); and (6) overall integration of the printed dopant, which may include controlled sheet resistance, counterdoping and/or outgassing of the dopant, compatibility of the dopant ink with other layers in device such as silicon dioxide, gate, etc.

In order to obtain tight control over the line shape, the ink composition generally requires sufficient control of the fluid mechanical properties (e.g., viscosity, rheology, surface tension, etc.) of the ink or solution used to form the printed dopant layer. Since the printed dopant layers can function as a dopant source for an underlying semiconductor structure, line shape and thickness control of the printed dopant layer may be important to ensure uniform doping of the underlying semiconductor structure and/or functionality of the feature. Excessive variability in the shape and/or thickness of a printed dopant layer may result in uneven doping of an underlying semiconductor structure. For example, a printed dopant layer having non-uniform film morphology may result in higher dopant levels in an underlying semiconductor structure where the printed dopant layer is thicker, and lower dopant levels in an underlying semiconductor structure where the printed dopant layer is thinner. This, in turn, can cause undesirable variability in the electrical characteristics of devices in different areas of the substrate.

Furthermore, curing or heating processes, which often follow printing, can cause line shape or pattern width distortion such as line waviness, spreading, or retraction. Such distortion can occur, for example, by a heat-induced width change resulting from a decreased viscosity of the printed dopant layer, and/or changes in the wetting characteristics of the printed composition due to the increased temperature. This can lead to inadvertent doping of areas not intended to be doped or covered with printed dopant ink. The consequences of such pattern waviness, spreading, or retraction may include (1) doping of areas not intended to be doped; (2) counter doping of N-type areas by P-type dopants; and/or (3) counter doping of P-type areas by N-type dopants.

These and other problems may prevent integration of printed dopant inks in an electronic device manufacturing process.

SUMMARY OF THE INVENTION

The present invention relates to dopant formulations (e.g., for forming doped semiconductor films), methods of forming dopant formulations, and methods of using such dopant formulations, and solves one or more problems associated with printable dopant compositions and their use in electronic device manufacturing processes. Printed dopant inks may enable a low-cost method for a printed approach to forming semiconductor layers (e.g., source/drain layers, gates, etc.) in the fabrication of semiconductor devices (e.g., MOS devices; see, e.g., U.S. Pat. Nos. 7,687,327, 7,701,011, and 7,767,520; and U.S. patent application Ser. Nos. 11/818,078, 11/203, 563, and 12/243,880; respectively filed on Jun. 12, 2007, Aug. 11, 2005, and Oct. 1, 2008, the relevant portions of each of which are incorporated by reference herein).

A first aspect of the present invention concerns dopant formulations generally comprising, (1) one or more polymer vehicles, (2) one or more dopants and/or dopant precursors, (3) optionally, one or more rheology modifiers or additives, and (4) one or more solvents in which the polymer vehicle(s), dopant(s) and/or dopant precursor(s), and optional rheology modifiers or additives are mixed. The dopant formulations described in detail herein may be advantageously used in a printing process (e.g., gravure printing, offset printing, flexographic printing, screen printing, inkjet printing, etc.) to cover areas of active semiconducting materials, such as silicon. In some exemplary embodiments (e.g., as described herein), the dopant formulations have a reduced metal content (e.g., a very low metal ion concentration), and thus have a relatively high purity level.

The dopant formulations of the present invention may be used to provide a printable dopant ink having suitable viscosity and rheological properties for printing and capable of preventing undesirable line or pattern distortion such as waviness, spreading, or retraction of the ink on a substrate. For example, a lower viscosity of a dopant ink may cause the ink to spread after printing and result in undesirable increased pattern width. On the contrary, when the viscosity of the dopant ink is too high, the high viscosity may cause handling problems such as delayed release of the ink from the screen (e.g., in cases where the ink is screen printed), or other defects known to those skilled in the art. Depending on the printed pattern, line, feature or area aspect ratios, the viscosity range of the present dopant ink formulations may be optionally more tightly adjusted to minimize pattern waviness, spreading or retraction as desired.

A second aspect of the present invention concerns methods of making dopant formulations. In one embodiment, the method generally comprises (a) combining one or more polymer vehicles with one or more first solvents to form a mixture; optionally, (b) reducing the content of a metal (e.g., selected from the group consisting of Ca, Fe, K, Li, Mg, Al, and Na) in the mixture to form a low metal content mixture; optionally, (c) adding one or more second solvents to the low metal-content mixture; and (d) adding one or more dopants and/or dopant precursors to the low metal-content mixture to form the dopant formulation, and optionally (e) adding a rheology modifier. In exemplary embodiments, the polymer vehicle(s) is dissolved in or mixed with the solvent(s) such that the resulting mixture constitutes a formulation that has defined rheological properties that makes the dopant formulation printable (e.g., preferably screen printable). Optionally, the ink properties can be further modified by adding known additives (e.g., rheology modifiers) to improve printability and resultant film quality.

Dopant inks (e.g., for screen printing, etc.) may be formulated with conventional polymer vehicle(s) and solvent(s) of industrial grade purity. However, dopant inks generally require a high purity level with a very low metal ion concentration. For example, and optionally, according to one or more specifications and/or based on device performance, the concentration of metal ions (e.g., Ca, K, Na, Fe, etc.) may be below 100 ppb. Ion exchange purification of a polymer vehicle solution (a stock solution), with subsequent filtration and evaporation as described herein, has been successfully used to prepare resin stock solutions of semiconductor-grade purity. On the contrary, in the absence of ion exchange purification, the concentration of metal ions is significantly higher (see, e.g., Table 1 in the section entitled "Examples" below) adversely affecting electrical device performance.

A third aspect of the present invention relates to methods of using the dopant formulations and inks disclosed herein. For example, in one embodiment, a doped semiconductor film can be made by depositing a dopant formulation as described herein semiconductor layer (e.g., which may be undoped or lightly doped), and then annealing (or driving in and activating) a resultant structure to diffuse a dopant into the semiconductor layer, and thus form a doped or heavily doped semiconductor layer. The doped semiconductor film made in accordance with the present invention may be used in various semiconductor devices, such as MOS transistors, diodes, resistors, capacitors, sensors, batteries, displays and solar cells.

In certain process flows or applications, the deposited dopant layer (e.g., which may be at least partially depleted of dopant) may stay in place after the formation of the doped semiconductor layer (i.e., after activation). Optionally, the deposited dopant layer (also referred to as "residue" or "dopant residue") may be substantially or entirely removed during and/or after dopant drive in and activation of the doped semiconductor layer. Both the ink composition and the annealing conditions may determine morphological characteristics of any residual dopant material which may remain after diffusion and/or activation. In instances where it is desirable to leave little or no dopant residue after activation, the dopant formulations and associated process flows described herein also address problems associated with poor residue removal (e.g., integration challenges with regard to layers above and below the residue, such as poor inter-layer dielectric and/or metal adhesion, gate oxide leakage, low gate oxide breakdown, misshapen vias and/or subsequent lithographic layers, surface leakage, poor contacts to silicon, etc.). The dopant formulations and/or process schemes of the present invention leave a substantially uniform residue after curing, enabling relatively easy removal of the residue.

In general, the dopant formulations and inks described herein are suitable for doping semiconductor materials. In order to achieve activation of all semiconducting features positioned below the printed ink, the process of printing the dopant-containing ink should have relatively tight control over line shape (thickness, profile, etc. as described above), dopant concentration, and ink composition, before diffusion of the dopant into the underlying semiconductor layer or feature. In a process flow in which the entire dopant film is removed after activation, it may be desirable to leave no dopant-containing ink residue (or at most a small amount of dopant-containing ink residue) in contact with the underlying P-type or N-type area. In the case where a small amount of such residue remains after dopant drive-in, this may facilitate removal of the remaining dopant ink (i.e., residue) after a diffusion and/or activation step.

The present invention provides dopant formulations, methods of making dopant formulations, and methods of using dopant formulations to form printed dopant layers and doped semiconductor films for semiconductor or solar applications. The present invention provides formulations and methods of printed dopant inks with sufficient control over thickness, line shape, and change in line shape with temperature which enable integration of printed dopant inks into a device manufacturing process.

These and other advantages of the present invention will become readily apparent from the detailed description of preferred embodiments below.

DETAILED DESCRIPTION

Figure 1:
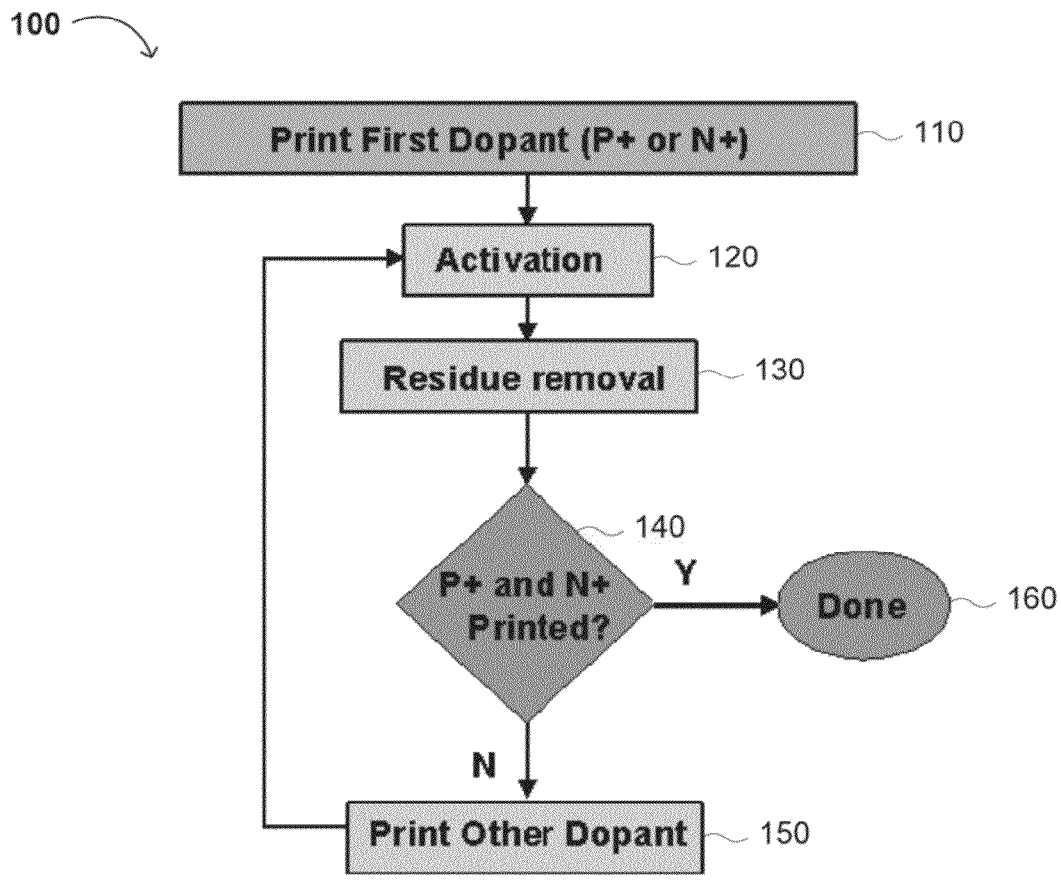
FIG. 1 is a flow diagram showing an exemplary sequential activation counter doping process according to embodiments of the present invention.

Reference will now be made in detail to various embodiments of the invention. While the invention will be described in conjunction with the following embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "$C_a$-$C_b$ alkyl," "$C_a$-$C_b$ alkoxy," etc. shall refer to both linear and, when the range from a to b encompasses three (3) or more carbon atoms, branched groups. Unless otherwise indicated, the terms "cyclo-" and "cyclic" refer to both mono- and polycyclic species. For the sake of briefness, the terms "halo-," "halogen," "halide" and grammatical derivations thereof may describe halogens as defined in the Periodic Table of Elements (F, Cl, Br, and I) and halogen-like species (e.g., species that form stable monovalent anions, often called pseudohalides) such as methanesulfonate (OMs), trifluoromethanesulfonate (OTf), toluenesulfonate (OTs), tetrafluoroborate ($BF_4$), hexafluorophosphate ($PF_6$), etc. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The terms "(semi)conductor," "(semi)conductive" and grammatical equivalents thereof refer to materials, precursors, layers, features or other species or structures that are conductive and/or semiconductive.

In the present description, the terms "stock solution" and "master batch" may be used interchangeably, and generally refer to a solution obtained after purifying one or more polymer vehicles to remove metal contaminants, but before adding any dopant or solvent to make a dopant ink formulation. Furthermore, the term "deposit" (and grammatical variations thereof) is intended to encompass all forms of deposition, including conventional blanket deposition (e.g., CVD and PVD), as well as coating, and printing of liquid based formulations. In various embodiments, coating or printing may comprise inkjet printing, gravure printing, screen printing, offset printing, flexo-printing, spray-coating, spin coating, slit coating, slit die coating, extrusion coating, dip coating, meniscus coating, microspotting and/or pen-coating the formulation onto the substrate. Also, unless otherwise indicated from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

The invention, in its various aspects, will be explained in greater detail below with regard to exemplary embodiments.

Exemplary Dopant (Ink) Formulations

A first aspect of the present invention relates to dopant ink formulations that may be advantageously used in a screen or other printing process (e.g., gravure printing, inkjet printing, flexographic printing, or any other printing process described herein) to cover and dope areas of active semiconducting materials, such as silicon. In general, exemplary dopant formulations comprise (a) one or more polymer vehicles; (b) one or more dopants and/or dopant precursors; (c) one or more solvents; and optionally (d) a glass or glass precursor additive; and optionally (e) one or more rheology modifiers or additives. A glass or glass precursor additive may be used to advantageously to react with the dopant, solvent, and/or polymer vehicle(s). Alternatively, the glass or glass precursor additive may be also used as a rheology modifier. The various components of the dopant formulations are typically available from commercial sources and are described in detail herein.

The polymer vehicle(s) are typically the principal component of the dopant (ink) formulation, and in exemplary embodiments, the polymer vehicle(s) may comprise or consist essentially of an organic polymer, such as an acrylic-, methacrylic-, or ethyl cellulose-based resin. In general, when an ink formulation with an organic polymer is deposited on a substrate and is subsequently cured, the organic polymer decomposes to leave essentially no or only a trace amount of carbon-containing residue. Although acrylic-, methacrylic-based, or ethyl cellulose-based resins are preferred polymer vehicles, the invention is not limited as such, and other polymers may be employed. Suitable polymer vehicles are widely commercially available in a large variety with respect to type of resin, molecular weight, glass transition temperature (Tg), acid value, viscosity, and solubility characteristics.

In one embodiment, the polymer vehicle(s) include an acrylic polymer comprising one or more polyacrylates and/or polymethacrylates. For example, in some variations, the acrylic polymer may comprise a poly($C_1$-$C_{10}$ linear and/or branched alkyl)acrylate and/or a poly($C_1$-$C_{10}$ linear and/or branched alkyl)methacrylate. In various embodiments, the acrylic polymer can be an acrylic homopolymer, an acrylic copolymer, and/or a blend of acrylic polymers. If the acrylic polymer is a copolymer, it may be a copolymer of two or more (meth)acrylate monomers, and the copolymer may be either a random copolymer or a block copolymer. In one exemplary embodiment, the poly($C_1$-$C_{10}$ linear and/or branched alkyl)methacrylate comprises poly(isobutyl)methacrylate.

In exemplary embodiments, the polymer vehicle(s) are present in the formulation in an amount of from about 1 wt. % to 60 wt. %, or any other value or range of values therein. For example, in some instances, the polymer vehicle(s) are present in an amount of from about 5 wt. % to 60 wt. %. In other instances, the polymer vehicle(s) are present in an amount of from about 10 wt. % to 40 wt. %.

Exemplary formulations of the present invention comprise one or more solvents. The solvent(s) can be any solvent or solvent combination with which the polymer vehicle(s), any optional glass precursor, any optional rheology modifier, and/or the dopant(s) can be mixed and/or in which the polymer vehicle(s) and/or the dopant(s) are soluble. Solvents suitable for use with embodiments of the present invention may comprise a linear, branched, and/or cyclic alkane, a linear, branched and/or cyclic alcohol, a linear, branched, or cyclic mono- or polyether, an aliphatic, alicyclic, or aromatic amine, ketones, and/or an unsubstituted or substituted aromatic. For example, the one or more solvents in the dopant formulation may comprise a $C_1$-$C_{20}$ linear, branched and/or cyclic saturated or unsaturated alcohol (e.g., ethanol, isopropanol, α-terpineol, etc.). Other suitable solvents may include a $C_6$-$C_{12}$ unsubstituted or substituted arene (e.g., toluene, xylene[s], etc.), a $C_5$-$C_{12}$ linear and/or branched alkane, a $C_6$-$C_{12}$ monocycloalkane, an aliphatic ether such as a di-$C_2$-$C_6$ alkyl ether, a methyl $C_4$-$C_6$ alkyl ether, or a di-$C_1$-$C_4$ alkyl $C_2$-$C_6$ alkylene diether [e.g., glyme], a cyclic ether [e.g., tetrahydrofuran, dioxane, etc.], a mono-, di- or tri-$C_1$-$C_{10}$ linear and/or branched amine, or a mono- or polycyclic aromatic amine [e.g., pyridine, quinoline, etc. In exemplary embodiments, the solvent comprises terpineol or a solvent mixture including terpineol. All forms of terpineol may be used.

In general, the solvent(s) are present in the formulation in an amount of from about 1 wt. % to 90 wt. %, or any value or range of values therein. For example, in one embodiment, the one or more solvents are present in the formulation in an amount of from about 20 wt. % to 80 wt. %. In another embodiment, the one or more solvents are present in an amount of from about 30 wt. % to 70 wt. %.

In some variations, the dopant formulation may comprise a single solvent. In other variations, the dopant formulation may comprise a mixture of first and second solvents. The first and/or second solvents may comprise any of the solvents described herein. For example, in one embodiment, at least one solvent comprises a $C_3$-$C_{20}$ linear, branched and/or cyclic, saturated or unsaturated alcohol, and optionally, another solvent in the solvent mixture comprises a $C_6$-$C_{12}$ unsubstituted or substituted arene. In embodiments comprising a first and a second solvent, the first and second solvents are generally present in a ratio of from about 1:10 to 10:1 (e.g., from about 1:2 to 2:1, or any value or range of values therein).

Exemplary formulations of the present invention may also comprise one or more dopants and/or dopant precursors (e.g., a "dopant source"). The dopant source may comprise one or more solid or liquid dopant precursors formulated into the ink. Such dopant precursor(s) may include one or more elements (or compounds thereof) from either Group IIIA of the periodic table (for diffusion into a P-type region of a semiconductor layer) and/or from Group VA of the periodic table (for diffusion into an N-type region of a semiconductor layer). For example, the dopant(s) and/or dopant precursor(s) may comprise one or more dopant compounds of the formula $D_a R^1_b$, where D is antimony, arsenic, phosphorous, boron, gallium, or aluminum; a is from 1 to 20; and b is from 0 to 26. In such formulations, each of the b instances of $R^1$ may be independently H, alkyl, aryl, aralkyl, a halogen, O, $OR_2$, $NR^2_2$, $AR^{2'}_3$ or $OAR^{2'}_3$, where $R^2$ is hydrogen, alkyl, aryl, aralkyl, or a halogen; $R^{2'}$ is hydrogen, alkyl, aryl, aralkyl or $A_y H_{2y+1}$; A is Si or Ge, and b is an integer corresponding to the number of binding sites available on the a instances of D.

In one embodiment, the dopant source comprises boron or a compound thereof. Preferred boron-containing compounds may be derived from boric acids, boronic acids, and/or borates. For example, the dopant compound(s) may be selected from the group consisting of $BR_3$, $B(OSiR_3)_3$, cyclo-(—[RB]—O—)$_3$, cyclo-(—[ROB]O—)$_3$, boric acid ($H_3BO_3$), and boron oxide ($B_2O_3$), where each R is independently $C_1$-$C_{10}$ linear and/or branched alkyl or $C_1$-$C_{10}$ linear and/or branched alkoxy. In other exemplary embodiments, the boron-containing precursor comprises triethylborate ($B(OEt)_3$), tris-trimethylsilylborate ($B(OSiMe_3)_3$), trimethylboroxine ($[B(Me)O]_3$), or trimethoxyboroxine ($[B(OMe)O]_3$).

In other implementations, the dopant source may comprise phosphorous or a compound thereof. In such embodiments, the dopant compound(s) may be selected from the group consisting of $H_3PO_4$, $H_3PO_3$, $P_2O_5$, $P_4O_{10}$ and $PO(OSiR_3)_3$, where each R is independently $C_1$-$C_{10}$ linear and/or branched alkyl or $C_1$-$C_{10}$ linear and/or branched alkoxy. Preferred phosphorous-containing compounds include phosphoric acid ($H_3PO_4$) and tris-trimethylsilylphosphate ($PO(OSiMe_3)_3$). Further examples of boron and phosphorous containing precursors suitable for use with present invention are also described in U.S. Pat. Nos. 7,701,001 and 7,767,520, the relevant portions of each of which are incorporated by reference herein.

In some embodiments, the dopant(s) and/or dopant precursor(s) comprise a doped glass (or a precursor of a glass material). Use of a doped glass precursor may address one or more problems associated with dopant compositions that include polymer vehicle(s) and either dopant(s) and/or dopant precursor(s) that may be hydrolyzed while doping a semiconducting layer. For example, a doped glass may advantageously reduce or prevent outdiffusion that can occur because certain dopant(s) and/or dopant precursor(s) may evaporate at higher temperatures and undesirably condense in area(s) which are not intended to be doped at all or are to be doped with the complementary dopant type (e.g., N-type dopant may be undesirably deposited onto P-type doped areas, P-type dopant may be undesirably deposited onto N-type doped areas, or dopant(s) may be deposited onto areas that are not intended to be doped). A doped glass precursor may also address the problems associated with the sensitivity of dopant ink compositions to the humidity of the environment.

The doped glass may comprise a silicate and/or aluminosilicate glass containing one or more dopant atoms (or compounds thereof) selected from the group consisting of boron, aluminum, gallium, phosphorous, arsenic, and antimony. In some instances the dopant source can be produced from a glass containing $B_2O_3$ or $P_2O_5$ and one or more of the oxides of Ba, Mg, Al, and/or Si. For example, in exemplary embodiments, the doped glass comprises a borosilicate glass (BSG), a phosphosilicate glass (PSG), BaO, MgO, $Al_2O_3$, $B_2O_3$ and/or $P_2O_5$. Such dopant sources may have certain advantages, such as improved out-diffusion characteristics, curing behavior, and sensitivity towards moisture. For example, dopants such as $B_2O_3$ or $P_2O_5$ may be advantageous because when structurally incorporated into a glass, they are generally less sensitive to the presence of adventitious or intrinsic moisture, and thus may significantly reduce the extent of undesired hydrolysis of the dopants in a dopant ink.

The doped glasses described herein may be used in powder form, or may be ground to micron or sub-micron scale (e.g., finely ground doped glass), for example having an average particle size of from about 100 nm to 100 μm, or any other value or range of values therein (e.g., 1 μm to 10 μm, etc.). Ground glass (e.g., frits) may be used, provided the ground glass does not contain undesired metal contaminants (e.g., Na, K, Ca, Fe, etc.) at levels significant enough to adversely affect the performance characteristics of semiconductor films and/or devices formed using inks containing such ground glass. During a high temperature curing process, the ground glass may melt to produce a uniform film, and the dopant(s) in the composition may diffuse into the underlying semiconductor layer. Melting of the glass and diffusion of the dopant(s) into the semiconductor layer may occur in parallel or sequentially.

In exemplary embodiments, the dopant(s) and/or dopant precursor(s) and/or doped glass can be dispersed in one or more solvents (e.g., to form a screen printable dopant ink) in an amount of from about 0.1 wt. % to about 50 wt. % (e.g., from about 1 wt. % to about 30 wt. %, from about 2 wt. % to about 10 wt. %, or any other value or range of values therein). The dopant composition may be held within tight limits (e.g., the concentration of dopant in the ink) to assure homogeneous distribution of dopant (e.g., boron oxide, phosphorous oxide, etc.) throughout the material.

In some embodiments, a glass or glass precursor may be optionally included into the dopant ink formulation. The glass or glass precursor may advantageously react with the dopant, the solvent, the polymer vehicle(s), or any combination thereof. The glass or glass precursor can also function as a rheology modifier, improving the properties of the ink to obtain printed lines or patterns with a tighter control over line or pattern width and line or pattern width distribution. Glass precursors include, but are not limited to, poly(perhydrosilazane), polysilazane, silesquioxane, silica colloids, hexamethyldisilizane, and metal alkoxides and silicon alkoxide such as TEOS. In exemplary embodiments, the glass precursor comprises poly(perhydrosilazane) and is included in the dopant ink formulation in an amount of from about 0.1% to about 10% by weight, or any value or range of values therein. It is understood that one or more components added while formulating the dopant ink may react with one or more other components of the dopant ink formulation, and that the actual composition of the dopant ink and printed dopant may be substantially different from the individual components prior to formulating the ink. The claims of this application are intended to cover such compositions that may change over time.

The order in which each component (e.g., polymer vehicle (s), solvent, dopant, glass precursor, etc.) is added in the dopant ink may or may not play an important role in the print behavior of the formulation and activation behavior of the dopant, and the present invention intends to encompass combining the components of the formulation in any possible sequence and/or manner. For example, in one embodiment, the glass precursor may be added at the end (after the polymer vehicle(s), solvent, and dopant sources are mixed). Optionally, the dopant source and glass precursor may be mixed together first, and this composition then added to the master batch and solvent system. In another variation, the dopant and glass precursor composition may be dissolved in the solvent, and then later combined with the master batch.

The polymer vehicle type, the solvent(s), the dopant precursor(s), and the optional glass precursor as described herein, and the ratios between them in the ink formulation generally determine the rheological properties of the dopant ink, such as viscosity and/or elasticity. However, the dopant formulation may also optionally include one or more (conventional) additives (e.g., a surface tension reducing agent, a surfactant, a binding agent, a thickening agent, a photosensitizer, etc.), which may be added to modify the ink rheology, impart desired characteristics to the dopant formulation, and to improve printability and resultant film quality. An extensive list of commercially available rheology modifiers can be found in "Rheology Modifiers Handbook—Practical Use and Application," by David B. Braun, Meyer R. Rosen, William Andrew Publishing, the relevant portions of which are incorporated by reference herein.

When rheology modifying additives are present, typical amounts of these components in the formulation are from 0.01 wt. % to 10 wt. % (e.g., in trace amounts, or from 0.1 wt. % to 5 wt. %) of the composition. For example, a surface tension reducing agent may be present in an amount of from 0.01 wt. % to 1 wt. %, preferably 0.02 wt. % to 0.1 wt. % of the dopant formulation. In certain embodiments, the surface tension reducing agent may comprise a conventional hydrocarbon surfactant, a conventional fluorocarbon surfactant or a mixture thereof. In some embodiments, a wetting agent may be present in an amount of from 0.05 wt. % to 1 wt. %, preferably 0.1 wt. % to 0.5 wt. % of the dopant formulation. In some variations, a surfactant may be present in an amount of from 0.01 wt. % to 1 wt. %, preferably 0.05 wt. % to 0.5 wt. % of the dopant formulation.

A binder and/or thickening agent may be present in an amount sufficient to provide the dopant (ink) formulation with predetermined flow properties at a given processing temperature. In exemplary embodiments, the dopant ink formulation has a viscosity (e.g., for screen printing) between 20,000 cP and 150,000 cP (or any value or range of values therein). In some instances, the ink viscosity is preferably between 20,000 cP and 100,000 cP, and more preferably, the viscosity is between 30,000 cP and 70,000 cP. For some applications, such as screen printing, it is preferred for the dopant ink viscosity to be between 40,000 cP and 60,000 cP (e.g., 50,000 cP, or any other value therein). However, for some printing processes, such as inkjet printing, gravure printing, offset printing, flexographic printing, etc., the dopant ink viscosity may be at least 2 cP (e.g., at least 10 cP, 15 cP, 20 cP, or any other minimum value of at least 2 cP). The viscosity of the dopant ink formulation is preferably measured or determined at a temperature of about 25° C. Exemplary dopant ink formulations are further described in detail herein (see, e.g., the section entitled "Examples" below).

Exemplary Methods of Purifying a Polymer Vehicle and Making a Dopant Formulation In certain preferred dopant ink formulations, the formulation has a (total) metal content (e.g., Ca, Fe, K, Li, Mg, Al, Na, etc.) of less than 100 ppb, or any other value or range of values less than 100 ppb (e.g., less than 50 ppb, less than 30 ppb, etc.). If the concentration of metal ions (e.g., Ca, Fe, K, Li, Mg, Al, Na, etc.) in the unpurified polymer vehicle and/or mixture of polymer vehicle and solvent is higher than desired, then the following method of purifying the polymer vehicle and/or making an ink formulation may be performed. The method generally comprises (a) combining one or more polymer vehicles with one or more first solvents to form a mixture; (b) optionally adding one or more second solvents to the mixture; optionally (c) reducing a content of a metal (e.g., selected from the group consisting of Ca, Fe, K, Li, Mg, Al, and Na) in the mixture by ion exchange purification to form a low metal content mixture; (d) adding one or more dopants and/or dopant precursors to the polymer vehicle(s) or low metal content mixture to form the dopant formulation; and optionally (e) adding one or more rheological modifiers, glasses or glass precursors, or other additives (e.g., as described herein).

In the present method, the mixture is prepared by combining any of the polymer vehicles described herein (e.g., ethyl cellulose polymer, an acrylic resin, an acrylate co-polymer or polymer blend, etc.) with one or more of the solvents described herein (see, e.g., the section entitled "Exemplary Dopant Formulations" above). The polymer vehicle(s) are generally present in the resulting (unpurified) mixture in an amount of from about 1 wt. % to 60 wt. % (e.g., 20 wt. % to 60 wt. %, 30 wt. % to 50 wt. %, or any other value or range of values therein).

Consequently, the metal content of the unpurified polymer/solvent mixture (e.g., a "stock solution") may subsequently be reduced to form a low metal content mixture. For example, in exemplary embodiments, an ion exchange purification process may occur by contacting the unpurified polymer mixture with an adsorbent and/or an ion-exchange resin. In some embodiments, the ion exchange resin comprises an acidic cation exchange resin, and the adsorbent is selected from the group consisting of diatomaceous earth, silica gel, alumina, and fluorinated silica gel.

The amount of adsorbent and/or ion-exchange resin added to the unpurified polymer mixture may be from about 1 wt. % to about 20 wt. % of the formulation (e.g., about 5 wt. % to 15 wt. %, or any other value or range of values therein). In some implementations, the unpurified polymer mixture and the adsorbent and/or ion-exchange resin may be in contact for a length of time from about 1 minute to about 96 hours, or any other value or range of values therein. For example, the method comprises contacting the polymer vehicle(s) with the adsorbent and/or the ion-exchange resin for about 1 hour to about 48 hours. Preferably, the contacting step is performed for a length of time necessary to reduce an individual or combined metal (e.g., Ca, K, Fe, Na, etc.) content of the polymer vehicle solution to less than 100 ppb (e.g., less than 50 ppb, less than 30 ppb, or any other value or range of values therein). The polymer mixture and the adsorbent and/or ion-exchange resin may be optionally heated during contact to a temperature of from about 30° C. to about 80° C. (e.g., from about 30° C. to about 50° C., or any value or range of values therein).

After the metal content of the polymer mixture is sufficiently reduced (e.g., to purify the polymer vehicle[s]), the adsorbent and/or ion-exchange resin may then be removed from the low metal content mixture. For example, the adsorbent and/or ion-exchange resin may be removed by filtration, centrifugation or decanting, or any other suitable separation technique for removing the adsorbent and/or ion-exchange resin from the purified polymer mixture known in the art. In some embodiments, the solvent content of the purified polymer mixture may be further reduced (e.g., by evaporating under reduced pressure, etc.) to yield a polymer vehicle stock solution of semiconductor-grade purity and/or a desired or predetermined polymer concentration.

In some embodiments, additional solvent(s) (e.g., a "second solvent" as stated above) can be added to the mixture to provide a less viscous polymer solution or system, which may be more practical for the ion exchange (purification) process. For example, ethanol or another relatively low viscosity and/or low boiling point organic solvent can be mixed with the polymer vehicle(s) (e.g., acrylic polymer or polymer blend, etc.) and the first solvent (e.g., terpineol, α-terpineol, toluene, etc.) to form a homogenous solution. Preferably, with regard to ion exchange purification, additional solvents have a low boiling point (e.g., less than 100° C., 85° C., about 80° C., etc.) so that they can be readily removed after the purification process. When the additional solvent (e.g., ethanol) is added to the mixture, the ion exchange purification procedure further comprises evaporating the additional solvent from the purified polymer mixture (e.g., a mixture of the polymer vehicle(s), the first solvent, and the additional solvent). However, in some embodiments, no additional solvent is added to the mixture. In embodiments where no additional solvent is used, evaporating the additional solvent is not necessary.

The final percentage of the polymer vehicle(s) in the stock solution after purification (and optionally after evaporation) can vary slightly. For example, based on thermogravimetric analysis (TGA) results, the percent of polymer vehicle(s) in one exemplary stock solution was 40.5±1.4% by weight. Typically, the viscosity of the master batch can range from about 350,000 cP to about 900,000 cP. In various exemplary embodiments, after evaporation of added ethanol, the master batch exhibits a viscosity in the range from about 550,000 cP to about 750,000 cP (or any other value or range of values therein).

After reducing the metal content of the mixture (e.g., by ion exchange purification), a suitable ink having a desired viscosity for printing (e.g., for screen printing) can be formulated by admixing one or more second solvent(s), one or more dopants and/or dopant precursors, and optionally one or more glass or glass precursors or rheology modifiers, as described herein, to the purified low metal content mixture. The one or more second solvent(s) may comprise any solvent described herein suitable for providing a dopant formulation having one or more predetermined characteristics and/or properties, and the one or more dopants and/or dopant precursors may comprise any dopant source described herein (see the section entitled "Exemplary Dopant Formulations" above) suitable for diffusion of a dopant into an underlying semiconductor layer or film.

For example, the dopant source may comprise one or more solid or liquid dopant precursors formulated into the ink. Such dopant precursor(s) may include one or more elements (or compounds thereof) from either Group IIIA of the periodic table (for diffusion into a P-type region of a semiconductor layer) and/or from Group VA of the periodic table (for diffusion into an N-type region of a semiconductor layer), as previously described herein with regard to exemplary dopant formulations. In some implementations, the dopant source may comprise boron or a compound thereof. Preferred boron-containing compounds may be derived from boric acids, boronic acids, and/or borates (see, e.g., the section entitled "Exemplary Dopant Formulations" above). In other implementations, the dopant source may comprise phosphorous or a compound thereof, as described in detail above with regard to exemplary dopant formulations. For example, some preferred phosphorous-containing compounds include phosphoric acid ($H_3PO_4$) and tris-trimethylsilylphosphate ($PO(OSiMe_3)_3$). Further examples of boron and phosphorous containing precursors suitable for use with present invention are also described in U.S. Pat. Nos. 7,701,001 and 7,767,520, the relevant portions of each of which are incorporated by reference herein.

In some exemplary embodiments, the dopants and/or dopant precursors added to the purified low metal content mixture comprise a doped glass, or a precursor of a glass-like material. In such embodiments, the doped glass may comprise a silicate and/or aluminosilicate glass containing one or more dopant atoms, or compounds thereof, as described herein. In some variations, the dopant source may be produced from a glass containing $B_2O_3$ or $P_2O_5$ and one or more of the oxides of Ba, Mg, Al, and/or Si, as described herein. The doped glass in the purified low metal content mixture may be added in powder form, or in some instances, may be (finely) ground to micron or sub-micron scale (e.g., having an average particle size of from about 100 nm to 100 μm, or any other value or range of values therein). In some embodiments, ground glass or frits having relatively low levels of undesired metal contaminants (e.g., less than 50 ppb, less than 30 ppb, etc.) may be added to the low metal content mixture. The dopant and/or dopant precursor(s) may be dispersed in one or more solvents as described herein in amount of from about 0.1 wt. % to about 50 wt. % (e.g., from about 1 wt. % to about 30 wt. %, from about 2 wt. % to about 10 wt. %, or any other value or range of values therein), for example, to form a screen printable dopant ink.

In some instances, it may be desirable to add a binder and/or thickening agent to the purified low metal content mixture in an amount sufficient to provide the dopant ink formulation with predetermined or desired flow properties at a given processing temperature (e.g., at a temperature of about 25° C.). In some exemplary embodiments, the final ink viscosity (e.g., for screen printing) is in the range from about 20,000 cP to about 150,000 cP (e.g., 20,000 cP to about 100,000 cP, 30,000 cP to about 70,000 cP, 40,000 cP to about 60,000 cP, or any other value or range of values therein). For some printing processes, such as inkjet printing, gravure printing, offset printing, flexographic printing, etc., the dopant ink viscosity may be at least 2 cP (e.g., at least 10 cP, 15 cP, 20 cP, or any other minimum value of at least 2 cP). In some of such embodiments, there may be no polymer vehicle, and one or more low viscosity solvents may be used. In addition, one or more additives as described herein may be optionally added to the dopant formulation to modify the ink rheology, obtain desired characteristics of the dopant formulation, and to improve printability and resultant semiconductor film quality as desired. Exemplary methods of making a dopant formulation are further described in detail herein (see, e.g., the section entitled "Examples" below).

Exemplary Methods of Using Dopant Ink Formulations and Making a Doped Semiconductor Film Further aspects of the present invention relate to methods of making a doped semiconductor film from the dopant formulations described herein. In general, the method comprises depositing the dopant formulation of the present invention on or over a semiconductor layer, and curing and/or annealing the resultant structure to diffuse a dopant into the semiconductor layer and form the doped semiconductor layer. In exemplary embodiments, the dopant formulation is deposited on the semiconductor layer by a printing process (e.g., a printing process known in the art, such as screen printing, gravure printing, flexographic printing, etc.).

The semiconductor layer may be formed on a substrate by depositing (e.g., by printing or coating, as described herein) a molecular and/or nanoparticle-based semiconductor ink, then converting it to an amorphous, hydrogenated silicon or polysilicon thin film (e.g., by heating and/or curing; see, e.g., U.S. Pat. Nos. 6,878,184, 7,314,513, 7,485,691, 7,674,926, and 7,879,696, the relevant portions of each of which are incorporated herein by reference). Alternatively, the semiconductor layer may be formed using another method known in the art (e.g., a blanket deposition technique such as PECVD, LPCVD, or sputtering).

In some instances, the semiconductor layer may be formed by depositing a semiconductor precursor ink (e.g., comprising a Group IVA element precursor, such as a silane, a (poly) silane, a (cyclo)silane, silicon and/or germanium nanoparticles, etc.) onto a substrate to form a film, drying and/or curing the film (generally by heating and/or annealing the dried ink for a length of time sufficient to cross-link, oligomerize and/or polymerize the silane or Group IVA element precursor, form a substantially uniform layer on the substrate, the layer comprising an oligo- and/or polysilane, and/or increase an average molecular weight, increase a viscosity and/or reduce a volatility of the composition), then partially or substantially completely crystallizing the semiconductor film pattern to form a polycrystalline (e.g., polysilicon), microcrystalline, or single-crystalline film. In general, a "silane" refers to a compound or mixture of compounds that contains primarily or that consists essentially of (1) silicon and/or germanium and (2) hydrogen, and the term "polysilane" refers to a silane or mixture of silanes that predominantly contains species having at least 15 silicon and/or germanium atoms. The term "(poly)silane" refers to a compound or mixture of compounds that consists essentially of one or more silanes, polysilanes or both. Such (poly)silane species (i.e., silane and/or polysilane) may contain one or more cyclic rings and an amount or atomic percentage of halogen atoms (such as Cl) that does not have a significant adverse effect on the properties of a given composition for a particular application.

Techniques for printing of a liquid semiconductor precursor ink directly onto a substrate (or a surface film thereof) to form a semiconductor layer are described in U.S. Pat. Nos. 7,314,5137, 7,701,001, 7,767,520, 7,485,691, 7,619,248, 7,687,327, and 7,879,696, and co-pending U.S. patent application Ser. No. 11/203,563, filed on Aug. 11, 2005, the relevant portions of each of which are incorporated herein by reference. Additional methods and materials for forming a semiconductor layer suitable for use with the present method (s) are described in U.S. Pat. No. 7,498,015, and co-pending U.S. patent application Ser. Nos. 11/867,587, 12/114,741, and 12/243,880, respectively filed on Oct. 4, 2007, May 2, 2008, and Oct. 1, 2008, the relevant portions of each of which are incorporated by reference herein.

Activation and doping of a semiconducting material (e.g., silicon, germanium, etc.) can be achieved by diffusing dopant impurities from the dopant ink into the underlying semiconductor layer, thereby lowering the resistivity of the areas containing diffused dopant(s). The dopant ink formulations described herein enable formation of a semiconductor layer or film with an activatable dopant. In order to achieve activation of all semiconducting features positioned below the printed dopant film, all components within the ink should be uniformly distributed before dopant diffusion (or after print). Optionally, impurities in the dopant ink formulations may be below a minimum level (e.g., less than 100 ppb, less than 50 ppb, etc.) to ensure desired activation. Consequently, the polymer vehicle(s) should be purified (e.g., through an ion removal and/or exchange step as described herein to remove a large or substantial quantity of metal impurities) before the final dopant inks are formulated (see the section entitled, "Exemplary Methods of Making a Dopant Formulation" above).

In exemplary embodiments, the dopant ink formulation of the present invention is printed in a desired pattern or feature on or over the semiconductor layer (e.g., by a printing process such as screen printing, flexographic printing, inkjet printing, etc.). The printed dopant ink pattern or feature is then cured (e.g., by heating or annealing) to drive the dopant into the underlying semiconductor layer or structure, and activate the dopant in the semiconductor layer. The curing or annealing process may occur as one step (e.g., a ramped anneal from low to high temperature), or optionally, as multiple steps (e.g., first a low temperature cure step known as "soft cure" followed by a higher temperature drive in and/or activation process.

The low temperature "soft cure" step may be optionally performed to drive off excess solvent. It can be done at temperatures ranging from about 50° C. to about 300° C., preferably between 50° C. and 100° C. Alternatively, the ink may be exposed to light (UV, excimer, etc.) to either drive off or advantageously cause a reaction in the ink (for example, when a photosensitizer additive is included in the formulation). Curing may be done in air or in a controlled ambient containing primarily $N_2$, $O_2$, or a mixture of $Ar/H_2$ or $N_2/H_2$. Water vapor may or may not be intentionally introduced during this step as well. Water vapor may advantageously hydrolyze some of the ink components. Curing may be done in a furnace, hot plate, an RTA, flash lamp furnace, etc. As stated above, this step may be done separately or may be combined with the relatively high temperature dopant drive-in and/or activation process.

The rheology of the ink may be selected such that the ink exhibits viscoelastic properties that ensure no or only a minimum degree of line or pattern distortion during the curing step. The curing time, temperature, and ambient conditions may be carefully selected to ensure that the ink essentially retains the desired dimensions and shape of the (printed) feature (e.g., as defined by a screen mask). The curing conditions may also be important for ensuring that dopants are available in sufficient quantity for subsequent diffusion and activation steps. In this respect, exact curing conditions can depend on the type of dopant precursor(s) and the chemical interactions between the dopant precursor(s) and other ink components during the curing process.

Dopant drive-in and activation are generally conducted at a temperatures above 600° C. (e.g., at a temperature in the range of 750-1100° C.), using furnace annealing or rapid thermal annealing (RTA). Drive-in and activation can be performed at times ranging from about 10 seconds to about 12 hours, preferably between 30 minutes and 6 hours. If activation is performed in an RTA, ramp rates can be between 1° C./s and 10° C./s. If activation is performed in a furnace, ramp rates can range from 1° C./min to 40° C./min. All or part(s) of the curing step may be performed in inert, oxidizing and/or reducing atmosphere. For example, a first curing step from room temperature to a first elevated temperature (e.g., 700° C., 600° C., 500° C. or lower) may occur in an oxidizing or reducing environment, while one or more subsequent curing steps at higher temperatures may be performed in an inert environment, or vice-versa. In an alternate embodiment, the dopant may be driven into the semiconductor layer (e.g., silicon, etc.) by UV-lamp flash annealing or laser irradiation, using a wavelength of light and/or a light power sufficient to diffuse a dopant from the dielectric into the semiconductor and/or activate the dopant once in the semiconductor. Many variations and permutations of the curing and annealing processes are contemplated in the present invention.

In regions where N-type doped semiconductor is required, an N-type dopant ink is printed above the semiconductor layer, then annealed or heated as described above. Conversely, in regions where P-type doped semiconductor is required, a P-type dopant ink can be printed above the semiconductor layer and annealed or heated as described above.

In some embodiments, N- and P-type dopant ink formulations can be printed, then diffused and activated at the same time. In the present method, both N-type and P-type structures, which are generally useful to make CMOS devices, may be present on the same substrate or chip. In general, either of two process flows may be employed to form both N-type and P-type structures on a substrate according to embodiments of the present invention: (1) a "sequential activation" process flow (in which a dopant of one type is printed then annealed to dope the underlying silicon, then a dopant of a the complementary type is printed and annealed to dope the underlying silicon) or (2) a "dual activation" process flow (in which a dopant of one type is printed, a dopant of the complementary type is printed, then both are annealed to dope the underlying silicon).

In other embodiments, dopant ink formulations can be printed to make structures or regions of relatively highly doped areas and relatively lightly doped areas of the same dopant type (for example, N-type dopant inks with high and low concentrations of phosphorous dopant can be used to make N-type lightly and highly doped silicon). Such processes are useful to make for example, a lightly doped drain in a transistor structure, transistors with different source/drain resistances, or resistors with different resistivities. It follows then that multiple regions of differing levels of doping and dopant type are possible with the dopant inks and processes described here (for example, highly and lightly doped N-type and highly and lightly doped P-type regions can all be formed on one substrate). As described above, each unique doped region can be formed individually (print, activate, print, activate, etc.) or concurrently (print region 1, print region 2, then activate both regions 1 and 2 at the same time).

FIG. 1 is a flow diagram showing the "sequential activation" doping process 100 according to embodiments of the present invention for the formation of P- and N-type devices on the same substrate. In this process flow 100, a first dopant ink formulation is printed (or otherwise deposited) at 110, on or over a semiconductor layer. Either a P+ dopant ink formulation may be printed first, or alternatively, the first dopant formulation may comprise an N+ dopant. After the first dopant is printed, the dopant (either P+ or N+) is annealed or activated, as shown in 120. Optionally, the first dopant residue may be removed from the structure at 130. Next, a second dopant is printed on the semiconductor layer at 150. The second dopant is generally complementary to the first dopant. However, as previously described herein, the second dopant can be of the same type but have a different dopant concentration. The second dopant is then activated at 120, and optionally, the second dopant residue may be removed at 130. In some implementations, the first and second dopants are of the same type (i.e., both are P-type or both are N-type), but vary with regard to the dopant concentration. Consequently, while the invention may be described with regard to formation of highly doped contacts from N-type and/or P-type dopant inks, the invention is not limited as such, and may include forming doped features having any dopant type in any dopant concentration.

Figure 2:
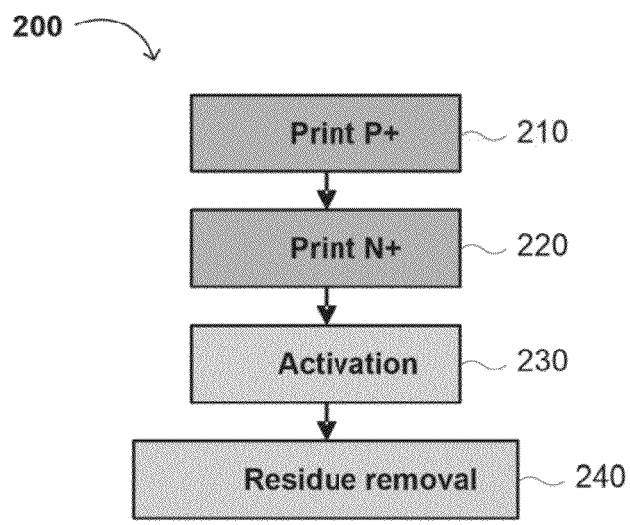
FIG. 2 is a flow diagram showing an exemplary dual activation counter doping process according to embodiments of the present invention.

The "dual activation" process flow 200 is shown in the flow diagram of FIG. 2. In the dual activation process flow 200, a first dopant ink formulation (e.g., P+ dopant) is printed or otherwise deposited on a semiconductor layer at 210, and a second dopant ink formulation (e.g., N+ dopant) is printed or otherwise deposited on a semiconductor layer at 220. After each printed step, the printed dopant ink may be optionally "soft cured" as previously described herein. In the alternative, all of the inks can be printed first, and then "soft cured" at the same time. Either the P+ or the N+ dopant formulation can be printed before the other dopant formulation, or the two dopant formulations can be printed simultaneously (e.g., using at least two inkjet heads [e.g., 2, 4, 6, 8 etc.], each of which is configured to print a different, and in some cases, complementary dopant ink). As shown at 230, both the P+ and N+ dopants are activated at the same time, and then optionally, the P+ and N+ dopant residues are removed at 240.

Depending on the concentration of dopant in the ink and the curing and/or annealing conditions, counter doping may occur, in which an N-type dopant contaminates one or more P-doped areas, and/or a P-type dopant contaminates one or more N-doped areas. Alternatively, outgassing may occur in which an N-type or P-type dopant dopes regions of the semiconductor layer intended to remain undoped or doped in a complementary manner.

In certain embodiments, a thin dielectric layer may be deposited onto a semiconductor layer prior to depositing a dopant ink to mitigate the effects of outgassing and/or counterdoping. The thickness of such layer is chosen to allow dopant penetration into the semiconductor layer, but to reduce or prevent out-diffusion of dopants into areas outside of the area(s) or region(s) to be doped with the patterned dopant.

For example, by depositing (e.g., by printing, coating or by conventional deposition means such as CVD, PECVD, etc.) a thin silicon oxide layer (e.g., having a thickness of 10-100 Angstroms, or any other value or range of values therein) over an entire substrate surface (including any semiconductor layers, islands and/or features) before printing or otherwise depositing a dopant formulation, the level of dopant out-diffusion can be dramatically reduced, while the dopant activation level can be maintained to a similar degree.

Although silicon dioxide is the preferred insulating material, other insulating layers may be possible (e.g., $Si_3N_4$, silicon oxynitrides, metal oxides such as $Al_2O_3$, $HfO_2$, $ZrO_2$, etc.). Silicon nitride and silicon oxynitride have been shown to be suitable insulating underlayers with printed dopants. Deposition of the underlayer can be performed using PECVD, CVD, ALD, sputter deposition, or other conventional methods for dielectric deposition. Deposition of the underlayer can also be achieved by coating conventional spin-on-glasses, polysilazane formulations and other processes and materials which can form a thin dielectric layer (e.g., chemical bath deposition of $SiO_2$ and alike). Optionally, silane based inks may be coated and oxidized to create a silicon dioxide layer. Thermal oxidation or low temperature oxidation of an underlying semiconductor layer or feature can also be used (e.g. $N_2O$ plasma, $O_2$ plasma, UV ozone oxidation, etc.). It is thought that the addition of such an underlying insulating layer (e.g., $SiO_2$) reduces the sticking coefficient of dopant(s) in the vapor form, thereby reducing undesired adhesion and/or deposition of outgassed dopant to the surface of areas not intended to be doped In addition, the type of ink, the ink composition, and the dopant concentration, as well as curing conditions and diffusion/activation conditions, may be important parameters for reducing or eliminating dopant outgassing and counter doping. The present dopant ink formulations may reduce or prevent counter doping by providing a printed line or other feature with tight control over line/feature width and shape, with minimal distortion (such as waviness, spreading or retraction), and tight control over the dopant concentration within the printed line or feature. Pattern distortion (e.g., waviness, spreading, retraction, etc.) may occur during relatively high temperature anneals.

The dopant ink formulations of the present invention may be deposited (e.g., by printing) on a plurality of transistor structures (e.g., source and drain regions, gates, gate oxides, etc.). Since the dopant formulation can be printed on a variety of structures, the source and drain regions, the gate and the gate oxide materials may be in contact with the dopant ink after the printing process, as well as during the curing and/or activation processes and/or the dopant residue removal process. In some embodiments, a poly gate (e.g., comprising or consisting essentially of polycrystalline silicon) may be employed. In other implementations, a metal gate (e.g., comprising or consisting essentially of aluminum, tungsten, molybdenum, etc.) can be used. The dopant ink type, composition and dopant concentration may be carefully selected to be compatible with various gate and gate oxide material(s). The dopant residue removal process, as discussed herein, may be fine-tuned to completely remove any ink residue after dopant activation in order to ensure a clean interface for deposition of a subsequent layer (e.g., an interlayer dielectric layer, a contact and/or interconnect metal, etc.).

After the dopant is driven into the underlying semiconductor layer and/or the dopant has been activated, the dopant ink residue may be removed from the structure. Varying amounts of residue and different residue profiles may be present after dopant activation, depending on the original ink composition, the feature size, the curing condition(s), the underlying surface characteristics (including type of material and surface energy), and the diffusion conditions. In one variation, the amount of residue present after the diffusion/activation step is minimal, to facilitate quick and efficient residue removal. The dopant ink formulations of the present invention are typically based on a polymer vehicle that decomposes at a relatively low temperature (e.g., lower than about 600° C.), compared to that applied during the diffusion step. Preferably, the decomposition products of the polymer vehicle substantially include or consist essentially of only small molecules that evaporate after decomposition. This ensures that most (but not necessarily all) of the organic polymer has been removed before the diffusion step, leaving behind only a small amount of residue. The dopant residue may be removed by cleaning or rinsing with deionized water, heated deionized water, aqueous hydrofluoric acid (e.g., 50:1, 500:1, 49%, etc.), aqueous phosphoric acid, conventional Piranha cleaning, any other standard cleaning solutions and/or etchant(s) known in the semiconductor industry, and/or any suitable combination thereof. Dry etching and/or cleaning steps may also be used such as ashing (e.g., treating with an $O_2$ plasma), treating with UV light and ozone, a plasma "steam" (e.g., a plasma comprising $H_2O$, and/or a mixture of $H_2$ and $O_2$) or high temperature steam introduced in a furnace treatment step.

In one variation comprising a P+ dopant ink, the compositional nature of the dopant residue was evaluated by XPS and was found to contain carbon and dopant (boron) In a control experiment with an ink that included a polymer vehicle and terpineol (but no dopant precursor) and that had undergone the same printing and curing processes, essentially no residue was found before the diffusion step and no activation of the semiconductor features occurred. Additional processing examples are described in detail herein (see the section entitled "Examples" below).

EXAMPLES

Purification of the Polymer Vehicle

Ion exchange purification of a (meth)acrylic resin (e.g., Dianal BR-101, which is an acrylic resin available from Dianal America, Inc., a subsidiary of Mitsubishi Rayon Co., Ltd.), which is typically the main component (polymer vehicle) of the screen printable dopant inks described herein, was done in three different solvents (i.e., iso-propanol, toluene, and ethanol) and an ethanol-terpineol mixture.

Stock Solution 1:

Alpha-terpineol was mixed with ethanol in ~ a 1/1 ratio. Dianal BR-101 polymer was added and dissolved. The mixture was prepared in such a way that the final concentration of BR101 in terpineol was ~40 weight %. To this mixture, 30-60 g of ion-exchange resin Dowex™ Monosphere™ 650C UPW was added and the resulting slurry was stirred at 40° C. for 24 hours. Subsequently, the ion exchange resin was removed from the mixture by filtration under pressure. Ethanol was then stripped from the solution under reduced pressure to yield a first polymer stock solution.

Stock Solution 2:

Alpha-terpineol was mixed with toluene in ~ a 2/1 ratio. Dianal BR-101 polymer was added and dissolved. The mixture was prepared in such a way that the final concentration of BR101 in terpineol was ~40 weight %. To this mixture, 30-60 g of ion-exchange resin Dowex™ Monosphere™ MR-3 UPW was added, and the resulting slurry was stirred at room temperature for 48 hours. Subsequently, the ion exchange resin was removed from the mixture by centrifugation. Toluene was stripped from the solution under reduced pressure to yield a second polymer stock solution.

Stock Solution 3:

Dianal BR-101 polymer was dissolved in isopropanol. Alpha-terpineol was added. The mixture was prepared in such a way that the final concentration of Dianal BR-101 in terpineol was ~ 50 weight %. To this mixture, 30-60 g of ion-exchange resin Dowex™ Monosphere™ 550A UPW was added, and the resulting slurry was stirred at 30° C. for 30 hours. Subsequently, the ion exchange resin was removed from the mixture by vacuum filtration. Isopropanol was stripped from the solution under reduced pressure to yield a third polymer stock solution.

In all cases there was a significant reduction in the concentration of calcium, potassium, sodium, and iron, as shown in Table 1 below:

TABLE 1

Results of ICP-MS Analysis of Dianal BR-101 in Different Solvents after Ion Exchange

| Ion | Detection Limits (ppb) | 15 wt % BR-101 in IPA w/out ion exchange | 15 wt % BR-101 in IPA after ion exchange | 15 wt % BR-101 in Toluene after ion exchange | 22 wt % BR-101 32 wt % Terpineol 46 wt % EtOH after ion exchange |
|---|---|---|---|---|---|
| Calcium | 5 | 420 | <5 | <5 | <5 |
| Iron | 5 | 29 | 16 | <5 | 11 |
| Potassium | 5 | 380 | <5 | 26 | <5 |
| Sodium | 5 | 1,700 | 7.0 | 15 | 5.6 |

Exemplary Ink Formulations for Supplying Uniform Dopant Ink Residue

The ink compositions as described herein can be employed in printing dopant layers. The advantages of these dopant ink formulations have been previously described herein.

Example 1, for a P-Doped Area

One exemplary ink composition includes:
Polymer resin: Isobutyl methacrylate BR-101 from Dianal
Terpineol
4 wt. % Triethylborate (TEOB)

Figure 3A:
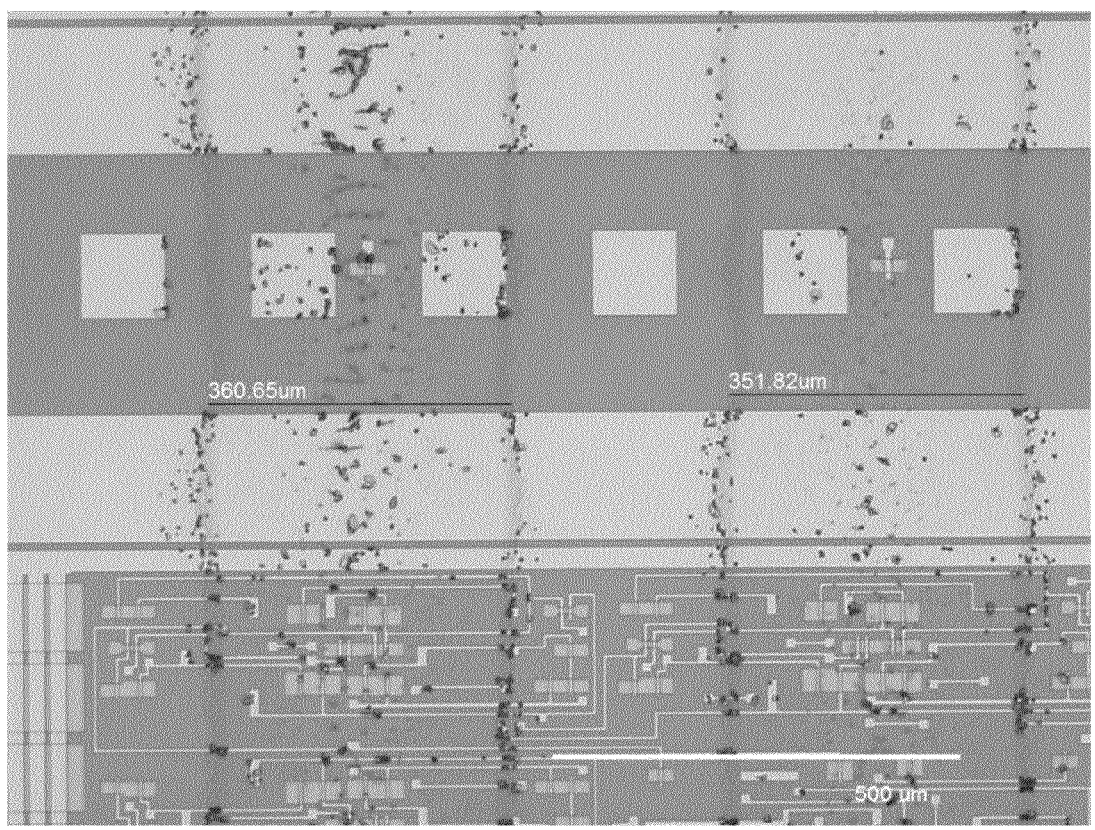
FIGS. 3A and 3B are optical images of non-uniform dopant layers having a residue pattern and/or accumulation of material in the middle of a printed line.
Figure 3B:
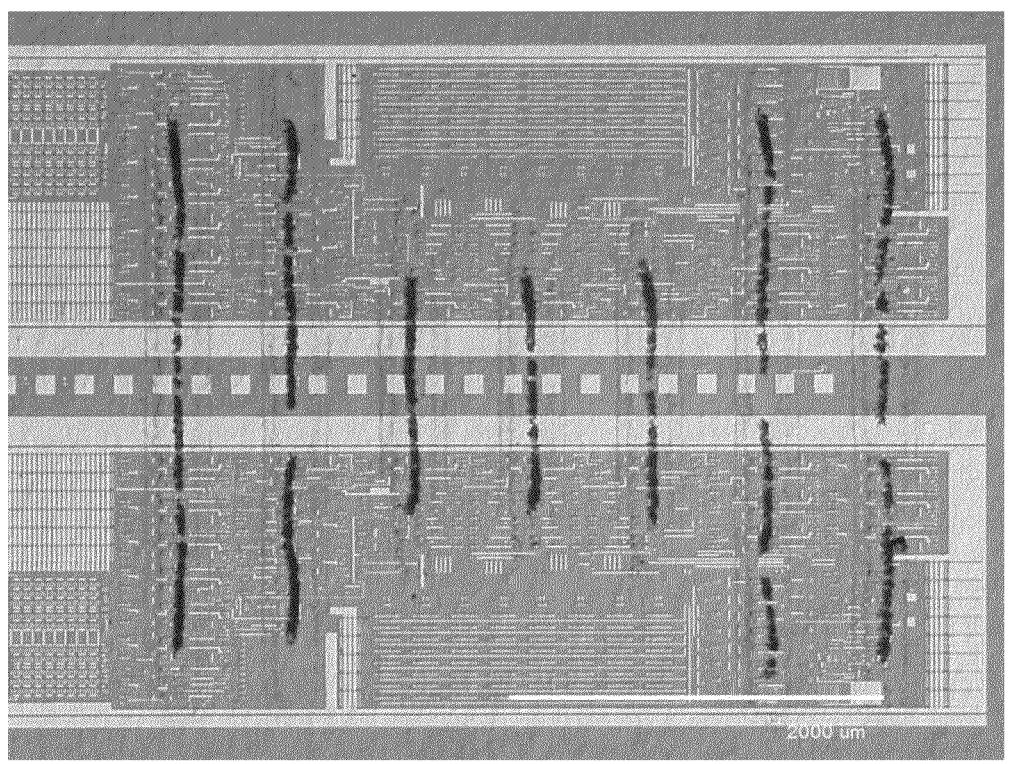

In some instances, the printed line may show a retraction, expansion, or other line distortions after curing and/or activation. This pattern is pronounced, more or less depending on the concentration of the dopant, polymer, solvent and/or other additives in the ink used to print the dopant layer. In addition, there may be substantial spreading or line distortion, for example, from a 240 micron line width after initial printing to 360 microns after curing and/or dopant activation. FIG. 3A is an optical image of a non-uniform-dopant layer showing post activation line distortion (e.g., an accumulation of the dopant material or residue in the middle of a printed line or pattern, significant material deposited at the edge of the line, etc.). The optical image in FIG. 3B shows another example of more pronounced material accumulation or line retraction on a metal foil substrate.

Example 2

A modified dopant ink may include a precursor of a glass material. In one embodiment, this precursor is polysilazane (PSZ). The ink composition may comprise, for example:

Polymer resin: Iso-butyl methacrylate BR-101 from Dianal
Terpineol
1 wt. % Trimethoxyboroxine (TMB)
2.2 wt. % AZ Spinfill 45002 (21 wt % of poly(perhydrosilazane) in dibutyl ether)

Figure 4:
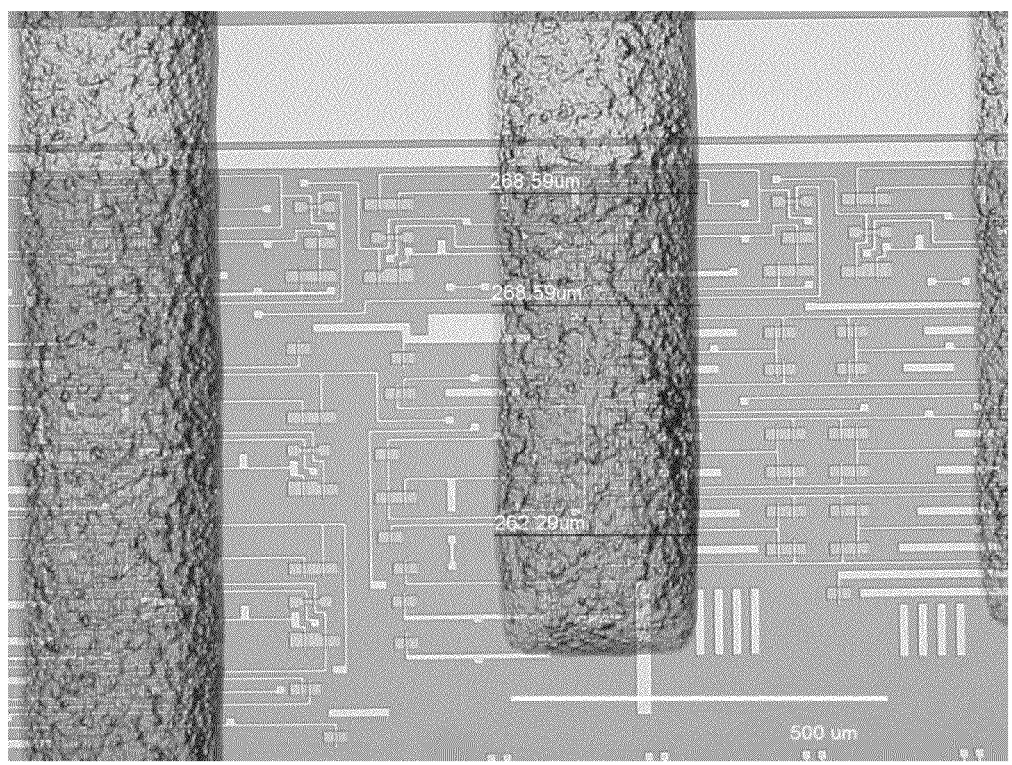
FIG. 4 is a micrograph of a screen print using an exemplary dopant formulation according to embodiments of the present invention.
Figure 5:
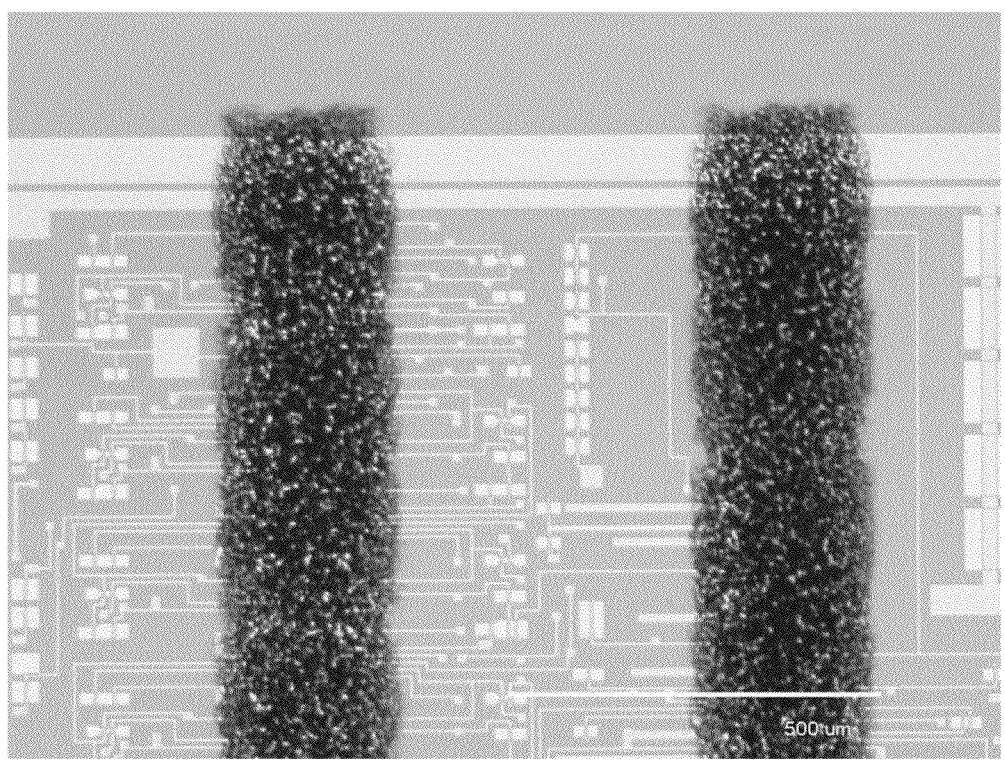
FIG. 5 is a micrograph showing typical dopant layer residue formation after diffusion and activation of the dopant from the formulation of FIG. 4.
Figure 6:
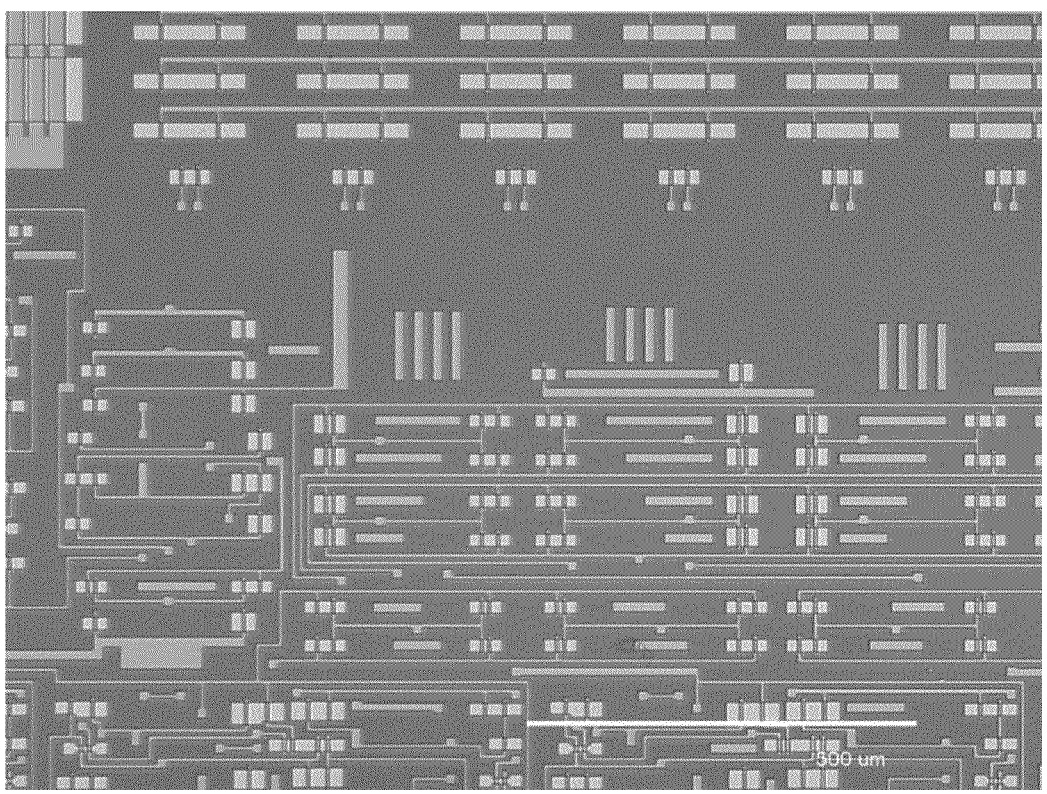
FIG. 6 is a micrograph showing a clean surface, without pitting of underlying layers, after removal of the residue shown in FIG. 5.

A micrograph of screen printed dopant after activation from this dopant ink formulation is shown in FIG. 5. The micrograph of FIG. 5 shows a representative residue formation after dopant activation of the screen printed dopant of FIG. 4. It can be seen that the critical line dimensions can be retained, and the residue of the printed dopant ink (believed to be mainly doped silica glass) is uniformly distributed after curing and/or activation. Dopant residue removal using a combination of an ash and an HF step leaves a clean surface, as shown in the micrograph of FIG. 6. An underlayer was deposited prior to printing (50 A $SiO_2$ deposited by PECVD). Methods employing similar reactive boron precursors to manufacture semiconductor devices may also be described in, e.g., U.S. Pat. No. 3,084,079.

Exemplary Printable Dopant Ink Formulations

The formulations of the present invention provide printable (e.g., screen printable) dopant inks, having a viscosity sufficient to prevent spreading behavior of the ink on a substrate.

Example 3

A P+ dopant ink was formulated by combining 81.3 wt. % of a stock solution of an acrylic polymer vehicle with alpha-terpineol having a viscosity of 575,000 cP with 14.8 wt. % of terpineol and 4 wt. % of triethylborate dopant. All ingredients were mixed well. The viscosity of this dopant ink was measured at 44,000 cP. 2 mm long features were screen printed and resulted in an average line width of 230 μm (235 μm feature size on screen) with a standard deviation of 7 μm.

Example 4

An N+ dopant ink was formulated by combining 77.5 wt. % of a stock solution of an acrylic polymer vehicle having a viscosity of 553,000 cP with 18.5 wt. % of terpineol and 4 wt. % of tris(trimethylsilyl) phosphate dopant. All ingredients were mixed well. The viscosity of the resulting dopant ink was measured at 50,000 cP. 2 mm long features were screen printed and resulted in an average line width of 270 μm (270 μm feature size on screen) with a standard deviation of 17 μm.

Example 5

An N+ dopant ink was formulated similarly to the ink of Example 4 except with using 0.5% wt. % of phosphoric acid dopant. The viscosity of the resulting ink was measured at 50,000 cP. An underlayer was deposited prior to printing (35 A $SiO_2$ deposited by PECVD).

Exemplary Process Schemes Employing the Present Dopant Ink Formulations

Figure 7:
FIG. 7 is a micrograph is a screen print using another exemplary dopant formulation according to embodiments of the present invention.

In one example, a thin undoped dielectric film was formed by coating a diluted solution of AZ Spinfill 45002 on a silicon substrate. In this example, a silicon substrate was used. However, the invention is not limited as such, and printed dopant inks may be used on other substrates (e.g., plastic, steel, glass, etc.) so long as the curing steps are compatible with the substrate. Although this example employed AZ Spinfill 45002, other comparable or suitable spin-on dielectric or polymer solutions, as well as conventional deposition techniques (e.g., PECVD, LPCVD, etc.), may also be used. After curing the coating film at a low temperature in air the P+ ink described above in Example 1 was screen printed on top of the low temperature cured film. The resulting structure was soft cured (e.g., at 80° C.). A representative result of this exemplary process scheme is shown in the micrograph of FIG. 7.

Figure 8:
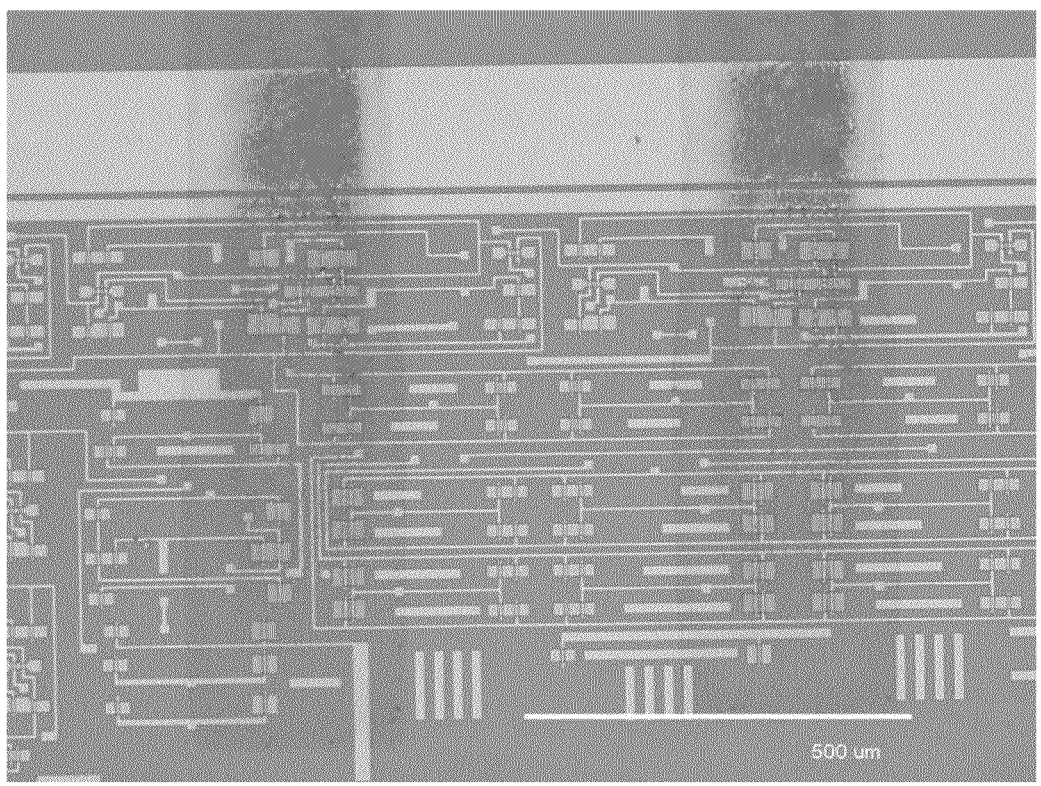
FIG. 8 is a micrograph showing the printed dopant layer residue after activation of the dopant diffused from the formulation in FIG. 7.
Figure 9:
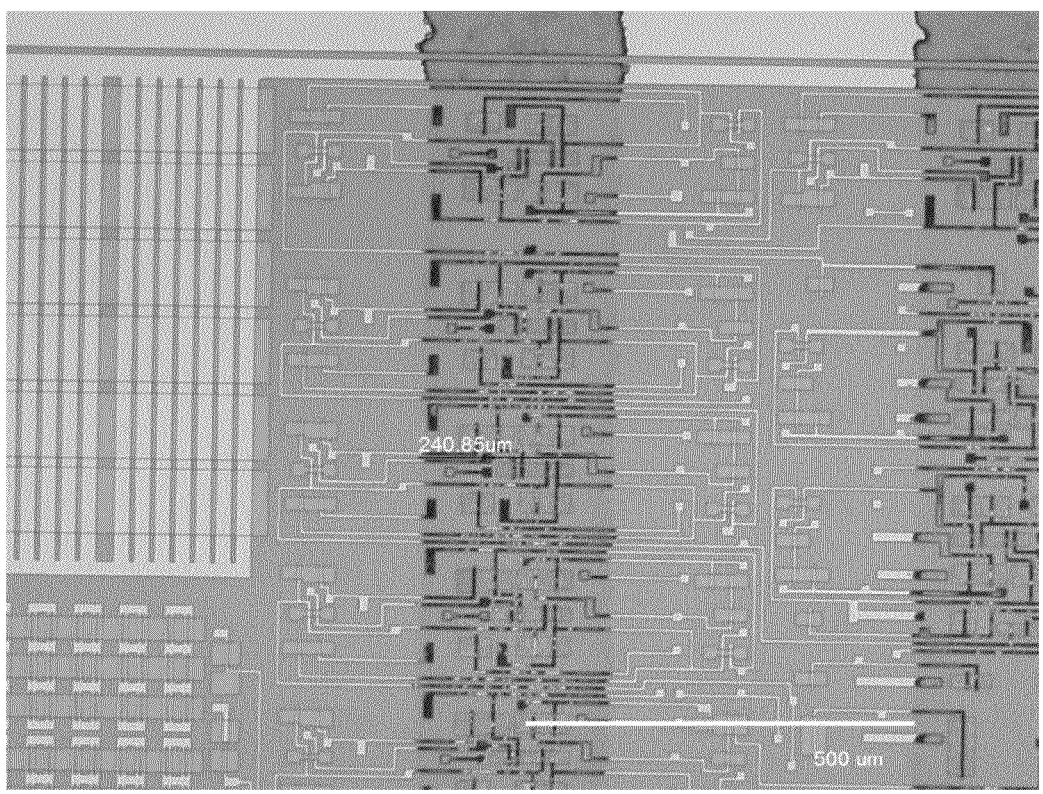
FIG. 9 is a micrograph showing an example of a screen print having essentially no line spreading formed in accordance with embodiments of the present invention.
Figure 10:
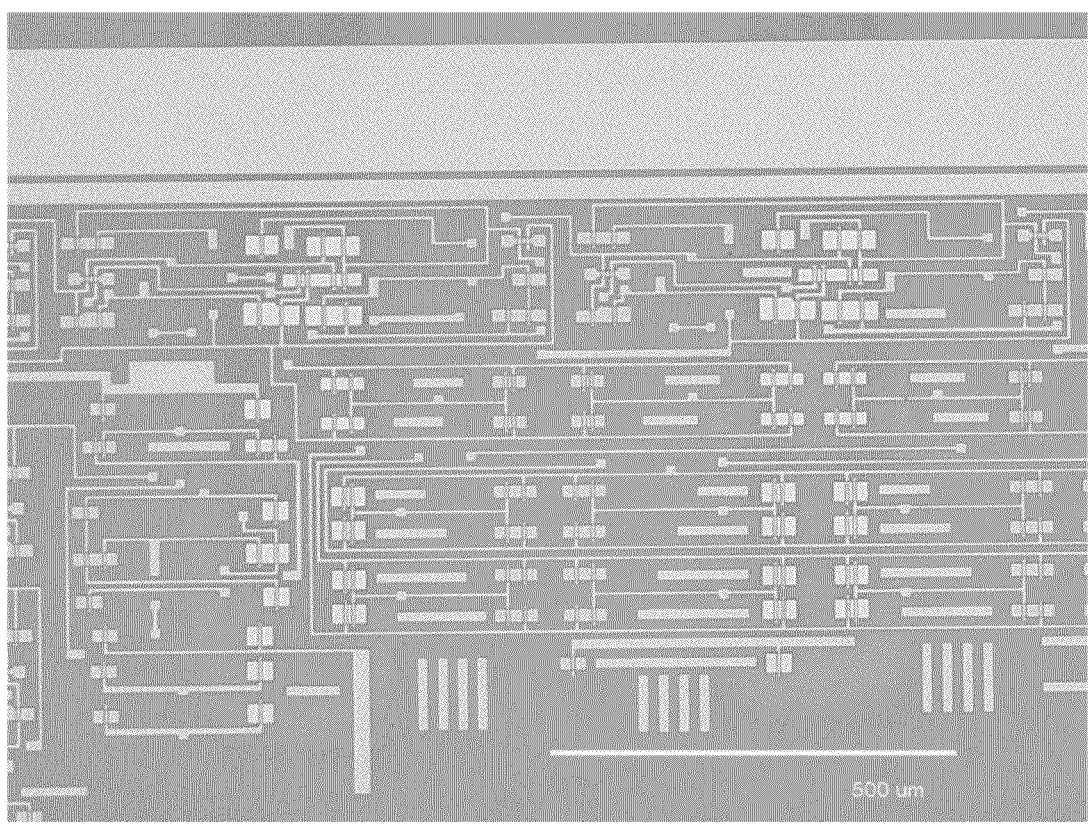
FIG. 10 is a micrograph showing a uniform dopant residue layer pattern in a further example in accordance with embodiments of the present invention.

The printed dopant ink residue after activation is shown in FIG. 8. As can be seen, a relatively uniform residue remains. Another example is shown in the micrograph of FIG. 9. As shown in FIG. 9, there is essentially no line spreading. Furthermore, dopant ink residue can be removed easily, as shown in FIG. 10

CONCLUSION/SUMMARY

Thus, the present invention provides printable dopant formulations, methods of making such dopant formulations, and methods of using such dopant formulations. The dopant formulations described herein provide a printable dopant ink having a viscosity sufficient to prevent undesirable ink spreading behavior when deposited on a substrate. In addition, the ion exchange purification process described herein (e.g., to reduce the metal ion concentration of one or more polymer vehicles in some embodiments of the invention) results in a dopant formulation having a relatively high purity level. Consequently, the dopant formulations and methods of making dopant formulations described herein provide uniform dopant inks that leave a uniform residue after curing, such that the residue can be easily removed, thereby addressing problems associated with dopant residue. The dopant formulations and inks described herein can be used to make a doped semiconductor film, which can be used in various semiconductor devices, such as MOS transistors, diodes, MOSFET devices, SOI devices, bipolar transistors, thin film transistors, light sensors, image sensors, light emitting diodes, MEMS devices, display applications, chemical or biological sensors, and solar applications, such as photovoltaic and other solar cells.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of making a dopant formulation, comprising:
   a) combining one or more polymer vehicles selected from the group consisting of polyacrylates and polymethacrylates with one or more first solvents selected from the group consisting of alkanes, alcohols, ethers, amines, ketones and arenes to form a mixture;
   b) contacting said mixture with an ion exchange resin for a length of time necessary to form a low metal content mixture having a total concentration of metal ions below 100 ppb;
   c) removing said ion exchange resin; and
   d) after removing said ion exchange resin, adding one or more dopant compounds and/or dopant precursors of antimony, arsenic, phosphorous, boron, or gallium to said low metal content mixture to form said dopant formulation.

2. The method of claim 1, wherein contacting said mixture with said ion exchange resin reduces a content of a plurality of metals selected from the group consisting of Ca, Fe, K, Li, Mg, Al and Na in said mixture.

3. The method of claim 1, wherein said contacting step is conducted for a period of time from about 1 minute 24 hours to about 96 hours.

4. The method of claim 1, wherein said contacting step further comprises heating said mixture to a temperature of from about 30° C. to about 80° C.

5. The method of claim 1, wherein said contacting step comprises contacting said mixture with about 1 to 20 wt % of said ion exchange resin.

6. The method of claim 1, further comprising adding one or more second solvents to said mixture prior to contacting said mixture with an ion exchange resin.

7. The method of claim 6, further comprising reducing a solvent content of said low metal content mixture after removing said ion exchange resin.

8. The method of claim 1, wherein said one or more dopants and/or dopant precursors comprise a doped glass.

9. The method of claim 8, wherein said doped glass comprises a glass containing one or more oxides of one or more dopant atoms selected from the group consisting of B, Ga, P, As, and Sb.

10. The method of claim 8, wherein said doped glass comprises finely ground doped glass having an average particle size of from 100 nm to 100 µm.

11. The method of claim 1, wherein said one or more first solvents comprise a linear, branched and/or cyclic alkane, a linear, branched and/or cyclic alcohol, a linear, branched or cyclic mono- or polyether, an aliphatic, alicyclic or aromatic amine and/or an unsubstituted or substituted arene.

12. The method of claim 1, wherein said one or more first solvents comprise a $C_1$-$C_{20}$ linear, branched and/or cyclic saturated or unsaturated alcohol.

13. The method of claim 12, wherein said one or more first solvents further comprises a $C_6$-$C_{12}$ unsubstituted or substituted arene.

14. The method of claim 1, wherein the dopant formulation has a viscosity of from about 30,000-70,000 cP.

15. The method of claim 6, wherein said second solvent comprises a $C_6$-$C_{12}$ unsubstituted or substituted arene or a $C_1$-$C_6$ linear, branched or cyclic saturated alcohol.

16. The method of claim 15, wherein said second solvent has a boiling point of less than 100° C.

17. The method of claim 1, wherein said one or more polymer vehicles are present in an amount of from about 10 wt. % to 40 wt. % of the dopant formulation.

18. The method of claim 1, wherein said one or more dopant compounds and/or dopant precursors are present in an amount of from about 2 wt. % to about 30 wt. % of the dopant formulation.

19. The method of claim 18, wherein said one or more dopant compounds and/or dopant precursors are selected from the group consisting of dopant compounds of the formula $D_a R^1_b$, where D is antimony, arsenic, phosphorous, boron, or gallium; a is from 1 to 20; b is an integer corresponding to the number of binding sites available on the a instances of D; each of the b instances of $R^1$ may be independently H, alkyl, aryl, aralkyl, a halogen, O, $OR_2$, $NR^2_2$, $AR^{2'}_3$ or $OAR^{2'}_3$, where $R^2$ is hydrogen, alkyl, aryl, aralkyl, or a halogen, $R^{2'}$ is hydrogen, alkyl, aryl, aralkyl or $A_y H_{2y+1}$, and A is Si or Ge; and silicate and aluminosilicate glasses containing one or more dopant atoms or compounds thereof selected from the group consisting of boron, gallium, phosphorous, arsenic, and antimony.

* * * * *